(12) United States Patent
Kamizuru et al.

(10) Patent No.: US 12,392,895 B2
(45) Date of Patent: Aug. 19, 2025

(54) CONTROL CIRCUIT AND DISTANCE MEASUREMENT SYSTEM TO IMPROVE SENSITIVITY CHARACTERISTICS OF SPAD ELEMENT

(71) Applicant: SONY SEMICONDUCTOR SOLUTIONS CORPORATION, Kanagawa (JP)

(72) Inventors: Hayato Kamizuru, Kumamoto (JP); Daisuke Hirono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 921 days.

(21) Appl. No.: 17/310,815

(22) PCT Filed: Dec. 17, 2019

(86) PCT No.: PCT/JP2019/049482
§ 371 (c)(1),
(2) Date: Aug. 25, 2021

(87) PCT Pub. No.: WO2020/183843
PCT Pub. Date: Sep. 17, 2020

(65) Prior Publication Data
US 2022/0120898 A1 Apr. 21, 2022

(30) Foreign Application Priority Data
Mar. 12, 2019 (JP) .................................. 2019-044809

(51) Int. Cl.
*G01S 17/10* (2020.01)
*G01S 7/481* (2006.01)
(Continued)

(52) U.S. Cl.
CPC ............ *G01S 17/10* (2013.01); *G01S 7/4814* (2013.01); *G01S 7/4816* (2013.01); *G01S 7/4861* (2013.01); *G01S 7/4865* (2013.01)

(58) Field of Classification Search
CPC ...... G01S 17/10; G01S 7/4814; G01S 7/4816; G01S 7/4861; G01S 7/4865; G01J 1/42; H01L 31/10; H01L 31/107; H04N 25/70
See application file for complete search history.

(56) References Cited

U.S. PATENT DOCUMENTS

| 4,945,227 A | 7/1990 | Jones et al. |
| 2018/0097510 A1* | 4/2018 | Fenigstein ............. H04N 25/57 |

(Continued)

FOREIGN PATENT DOCUMENTS

| CN | 109644244 A | 4/2019 |
| DE | 3780647 T2 | 3/1993 |

(Continued)

OTHER PUBLICATIONS

International Search Report and Written Opinion of PCT Application No. PCT/JP2019/049482, issued on Feb. 18, 2020, 09 pages of ISRWO.

*Primary Examiner* — Jennifer D Bennett
(74) *Attorney, Agent, or Firm* — CHIP LAW GROUP (57) ABSTRACT

Provided is a control circuit and a distance measurement system. The control circuit includes first wiring to which a first power supply voltage is applied, second wiring to which a second power supply voltage is applied. The control circuit further includes a current supply unit, a first withstand voltage unit, an inverter connected to a cathode of the SPAD element, and a second withstand voltage unit. Furthermore, the control circuit includes an N-type first transistor that is provided between the cathode of the SPAD element and an input terminal of the inverter, and has a gate connected to the second wiring, and a P-type second transistor that is pro- (Continued)

vided between the second wiring and a source of the first transistor, and has a gate connected to an output terminal of the inverter.

5 Claims, 5 Drawing Sheets

(51) Int. Cl.
*G01S 7/4861* (2020.01)
*G01S 7/4865* (2020.01)

(56) References Cited

U.S. PATENT DOCUMENTS

| 2018/0270405 | A1 | 9/2018 | Ota | |
|---|---|---|---|---|
| 2018/0372539 | A1 | 12/2018 | Goden | |
| 2021/0067168 | A1* | 3/2021 | Kitano | H04N 25/633 |

FOREIGN PATENT DOCUMENTS

| EP | 0333751 A1 | 9/1989 |
|---|---|---|
| EP | 3567848 A1 | 11/2019 |
| JP | 02-500789 A | 3/1990 |
| JP | 2010-219661 A | 9/2010 |
| JP | 2014-081254 A | 5/2014 |
| JP | 2015-117970 A | 6/2015 |
| JP | 2018-157387 A | 10/2018 |
| JP | 2019-007877 A | 1/2019 |
| WO | 88/004034 A2 | 6/1988 |
| WO | 2019/031001 A1 | 2/2019 |

* cited by examiner

CONTROL CIRCUIT AND DISTANCE MEASUREMENT SYSTEM TO IMPROVE SENSITIVITY CHARACTERISTICS OF SPAD ELEMENT

CROSS REFERENCE TO RELATED APPLICATIONS

This application is a U.S. National Phase of International Patent Application No. PCT/JP2019/049482 filed on Dec. 17, 2019, which claims priority benefit of Japanese Patent Application No. JP 2019-044809 filed in the Japan Patent Office on Mar. 12, 2019. Each of the above-referenced applications is hereby incorporated herein by reference in its entirety.

FIELD

The present disclosure relates to a control circuit and a distance measurement system.

BACKGROUND

As one of distance measurement methods measuring a distance to an object to be measured by using light, a distance measurement method called a direct time of flight (ToF) measurement is known. In this direct ToF measurement, a light receiving element receives reflected light obtained by reflection of light emitted by a light source from the object to be measured, and a distance to the object is measured on the basis of a time from the emission of the light to the reception of light as the reflected light (e.g., see Patent Literature 1).

CITATION LIST

Patent Literature

Patent Literature 1: JP 2014-081254 A

SUMMARY

Technical Problem

However, in the above conventional art, it is difficult to improve a sensitivity characteristic of a single photon avalanche diode (SPAD) element that is used as the light receiving element.

Therefore, the present disclosure proposes a control circuit and a distance measurement system that are configured to improve a sensitivity characteristic of a SPAD element.

Solution to Problem

According to the present disclosure, there is provided a control circuit. The control circuit includes a first wiring, a second wiring, a current supply unit, a first withstand voltage unit, a inverter, and a second withstand voltage unit. The first power supply voltage is applied to the first wiring. The second power supply voltage lower than first power supply voltage is applied to the second wiring. The current supply unit supplies a predetermined current from the first wiring to the SPAD element. The first withstand voltage unit holds the lower voltage side of the current supply unit at a voltage equal to or above the second power supply voltage. The inverter is connected to the cathode of the SPAD element. The second withstand voltage unit holds the inverter at a voltage equal to or below the second power supply voltage. Furthermore, the second withstand voltage unit has an N-type first transistor and a P-type second transistor. The N-type first transistor is provided between the cathode of the SPAD element and the input terminal of the inverter, and has a gate that is connected to the second wiring. The P-type second transistor is provided between the second wiring and the source of the first transistor, and has a gate that is connected to the output terminal of the inverter.

Advantageous Effects of Invention

According to the present disclosure, the sensitivity characteristic of the SPAD element can be improved. It should be noted that the effects described here are not necessarily limited and may be any of the effects described in the present disclosure.

DESCRIPTION OF EMBODIMENTS

Embodiments of the present disclosure will be described below in detail with reference to the drawings. Note that in the following embodiments, the same portions are denoted by the same reference numerals and symbols, and redundant description thereof will be omitted.

As one of distance measurement methods measuring a distance to an object to be measured by using light, a distance measurement method that is called direct ToF measurement is known. In this direct ToF measurement, a light receiving element receives reflected light obtained by reflection of light emitted by a light source from the object to be measured, and a distance to the object is measured on the basis of a time from the emission of the light to the reception of light as the reflected light.

However, in the above conventional art, it is difficult to improve a sensitivity characteristic of a SPAD element that is used as the light receiving element.

This is because the sensitivity characteristic of the SPAD element is improved as the value of voltage applied to a cathode of the SPAD element is higher, but it is difficult to make the value of the voltage applied to the cathode of the SPAD element higher than the withstand voltages of various transistors constituting an application circuit.

Therefore, it is expected to achieve a control circuit and a distance measurement system that are configured to overcome the problem described above and improve the sensitivity characteristic of the SPAD element.

[Distance Measurement Method]

The present disclosure relates to a technology performing distance measurement by using light. Therefore, a distance measurement method applicable to the embodiments will be described with reference to FIGS. 1 and 2 to facilitate understanding of the embodiments of the present disclosure.

Figure 1:
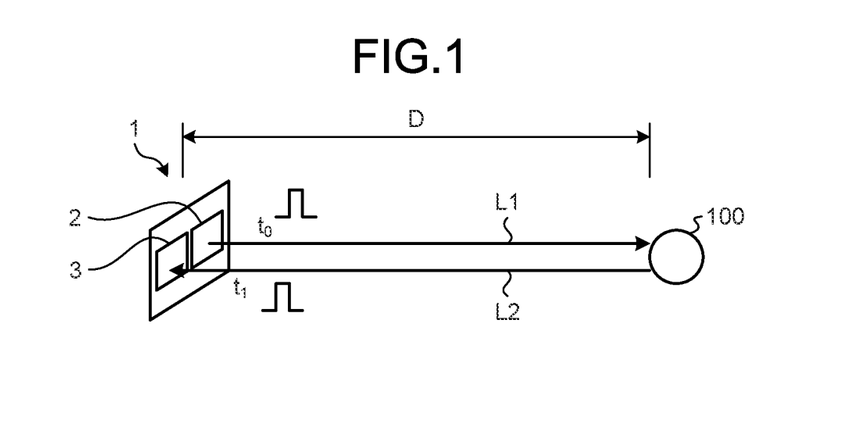
FIG. 1 is a diagram schematically illustrating distance measurement by direct ToF measurement applicable to an embodiment of the present disclosure.

FIG. 1 is a diagram schematically illustrating distance measurement by the direct ToF measurement applicable to an embodiment of the present disclosure. In the embodiment, the direct ToF measurement is applied as the distance measurement method.

This direct ToF measurement is a method in which a light receiving unit 3 receives reflected light L2 obtained by reflection of emitted light L1 emitted by a light source unit 2 from a object 100 to be measured, and the distance measurement is performed on the basis of a time of a difference between light emission timing and light reception timing.

A distance measurement device 1 includes the light source unit 2 and the light receiving unit 3. The distance measurement device 1 is an example of the distance measurement system. The light source unit 2 has a light source 4 (see FIG. 3) that is, for example, a laser diode and is driven to emit pulsed laser light.

The emitted light L1 emitted from the light source unit 2 is reflected by the object 100 to be measured and is received as the reflected light L2 by the light receiving unit 3. The light receiving unit 3 includes a pixel array unit 6 (see FIG. 3) configured to photoelectrically convert light into an electric signal to output the signal according to the received light.

Here, the time (light emission timing) at which the light source unit 2 emits light is defined as time to, and the time (light reception timing) at which the light receiving unit 3 receives the reflected light L2 obtained by reflecting the emitted light L1 emitted by the light source unit 2 by the object 100 to be measured is defined as time $t_1$.

When a constant c is a light speed ($2.9979 \times 10^8$ [m/sec]), a distance D between the distance measurement device 1 and the object 100 to be measured is calculated according to the following formula (1).

$$D=(c/2) \times (t_1-t_0) \quad (1)$$

Note that the distance measurement device 1 preferably repeats the above processing a plurality of number of times. Furthermore, the light receiving unit 3 may have a plurality of the SPAD elements 6a (see FIG. 4) so as to calculate the distance D on the basis of light reception timing at which the reflected light L2 is received by each SPAD element 6a.

The distance measurement device 1 classifies time periods $t_m$ (hereinafter, also referred to as "light reception time periods $t_m$") from the time to as the light emission timing to the light reception timing at which the light is received by the light receiving unit 3, on the basis of classes (bins), and generates a histogram.

Figure 2:
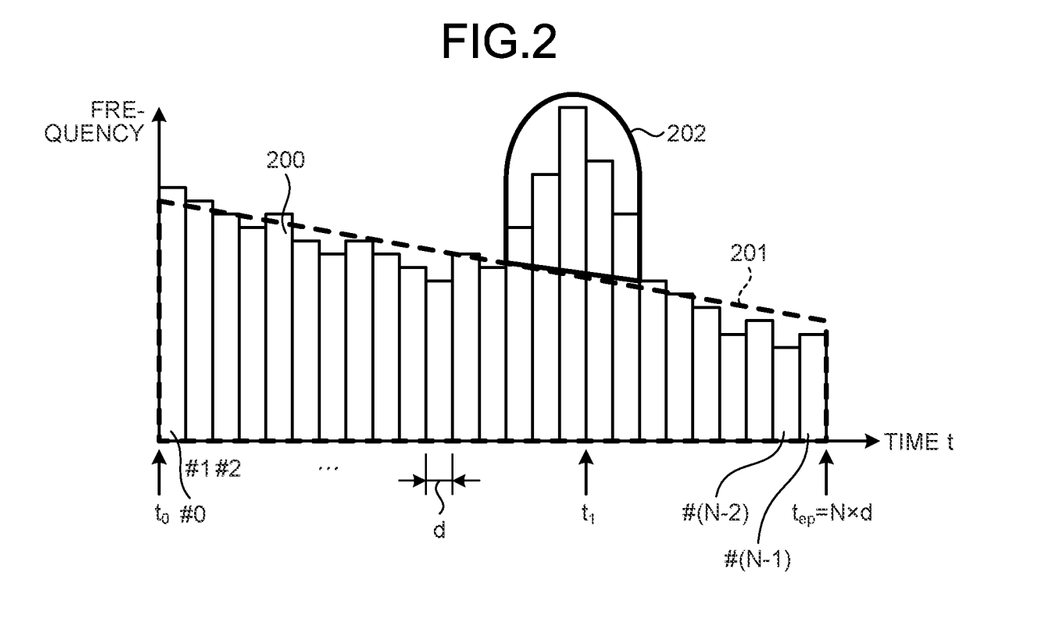
FIG. 2 is a diagram illustrating an example of a histogram based on the time at which a light receiving unit applicable to the embodiment of the present disclosure receives light.

FIG. 2 is a diagram illustrating an example of the histogram based on the time at which the light receiving unit 3 applicable to the embodiment of the present disclosure receives light. In FIG. 2, the horizontal axis represents bins, and the vertical axis represents the frequency in each bin.

The bins represent the light reception time periods $t_m$ divided into predetermined unit time intervals d.

Specifically, a bin #0 is $0 \le t_m < d$, a bin #1 is $d \le t_m < 2 \times d$, a bin #2 is $2 \times d \le t_m < 3 \times d$, . . . , and a bin #(N-2) is $(N-2) \times d \le t_m < (N-1) \times d$. In a case where exposure time of the light receiving unit 3 is time $t_{ep}$, $t_{ep}=N \times d$.

The distance measurement device 1 counts the number of the light reception time periods $t_m$ acquired, on the basis of the bins, obtains the frequency 200 for each bin, and generates the histogram. Here, the light receiving unit 3 also receives light other than the reflected light L2 obtained by reflecting the emitted light L1 from the light source unit 2.

For example, an example of the light other than reflected light L2 as a target includes ambient light around the distance measurement device 1. The ambient light is light that is incident on the light receiving unit 3 at random, and an ambient light component 201 due to the ambient light in the histogram is noise to the reflected light L2 as the target.

Meanwhile, the reflected light L2 as the target is light received according to a specific distance, and appears as an active light component 202 in the histogram. The bin corresponding to a peak frequency in the active light component 202 is the bin corresponding to the distance D of the object 100 to be measured.

The representative time of the bin (e.g., time at the center of the bin) is acquired as the time $t_1$ described above, and thus, the distance measurement device 1 can calculate the distance D to the object 100 to be measured, according to formula (1) described above. In this way, using a plurality of results of the light reception, appropriate distance measurement can be carried out against the random noise.

[Configuration of Distance Measurement Device]

Figure 3:
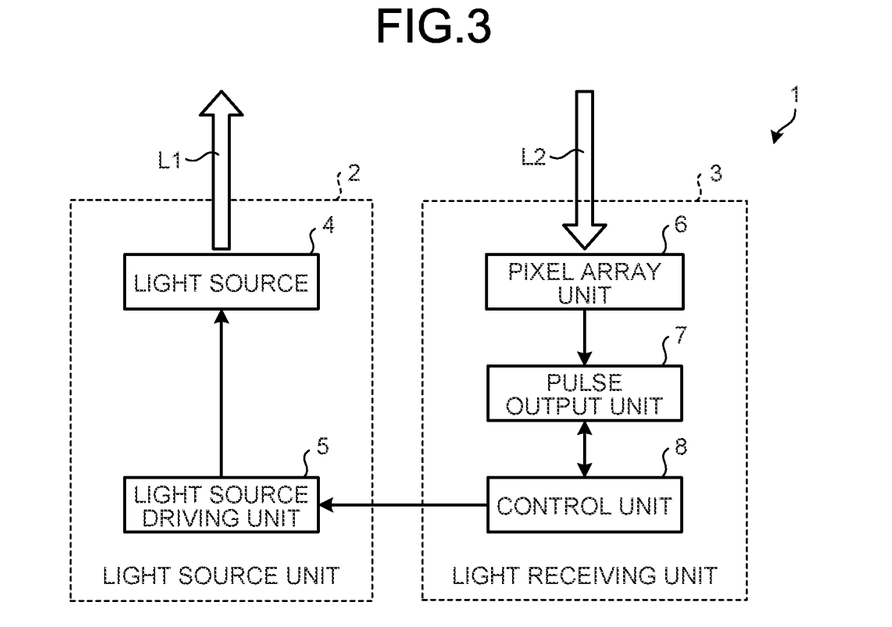
FIG. 3 is a block diagram illustrating a configuration example of a distance measurement device according to the embodiment of the present disclosure.

Next, a configuration of the distance measurement device 1 according to the embodiment will be described with reference to FIGS. 3 and 4. FIG. 3 is a block diagram illustrating a configuration example of the distance measurement device 1 according to the embodiment of the present disclosure. As described above, the distance measurement device 1 includes the light source unit 2 and the light receiving unit 3.

The light source unit 2 has the light source 4 and a light source driving unit 5. The light source 4 includes, for example, a laser diode such as a vertical cavity surface emitting laser (VCSEL). Note that the light source 4 is not limited to the VCSEL and may use a laser diode array or the like in which laser diodes are arranged on a line.

The light source driving unit 5 drives the light source 4. The light source driving unit 5 drives the light source 4 so that the light source 4 emits the emitted light L1 having a predetermined timing and pulse width on the basis of, for example, a light emission control signal from a control unit 8 of the light receiving unit 3.

The light source driving unit 5 can drive the light source 4 such that, for example, laser light is scanned from the light source 4 having laser diodes arranged on a line, in a direction perpendicular to the line.

The light receiving unit 3 has the pixel array unit 6, a pulse output unit 7, and the control unit 8.

The pixel array unit 6 has the plurality of SPAD elements 6a (see FIG. 4) arranged into a two-dimensional lattice. In each of these SPAD elements 6a, applying a large reverse bias voltage at which avalanche multiplication occurs to the cathode, electrons generated according to incidence of one photon causes the avalanche multiplication on the inside.

In other words, the SPAD element 6a has a characteristic that causes a large current flow in response to incidence of the one photon. Therefore, in the SPAD element 6a, the incidence of the one photon included in the reflected light L2 with high sensitivity can be detected by using such a characteristic.

The operation of the plurality of SPAD elements 6a in the pixel array unit 6 is controlled by the control unit 8. For example, the control unit 8 can control reading of a signal from each SPAD element 6a for each block including (n×m) SPAD elements 6a of n pixels in a row direction and m pixels in a column direction.

Furthermore, in each block as a unit, the control unit 8 can read the signal from each SPAD element 6a by scanning the respective SPAD elements 6a in a row direction and further scanning the SPAD elements 6a in a column direction for the respective rows.

Note that, in the embodiment, the control unit 8 may individually read the signal from each SPAD element 6a. The signal generated by the SPAD element 6a of the pixel array unit 6 is supplied to the pulse output unit 7.

The pulse output unit 7 outputs a predetermined pulse signal as a digital signal to the control unit 8 according to the signal generated by the SPAD element 6a. Details of the pulse output unit 7 will be described later.

The control unit 8 controls the entire operation of the distance measurement device 1, according to, for example, programs installed in advance. For example, the control unit 8 controls the light source driving unit 5 to control the light emission timing of the light source 4.

Furthermore, the control unit 8 generates the histogram illustrated in FIG. 2, on the basis of the pulse signal output from the pulse output unit 7. In addition, the control unit 8 performs predetermined arithmetic processing on the basis of data in the generated histogram to calculate the distance D to the object 100 to be measured.

Figure 4:
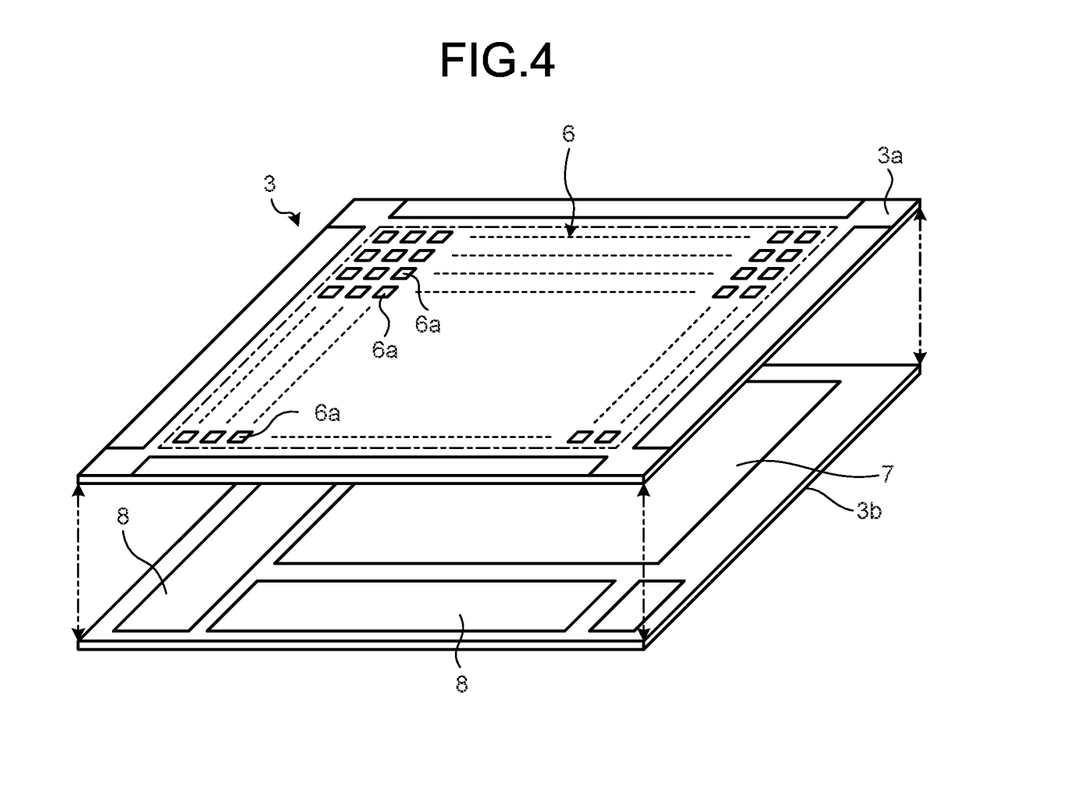
FIG. 4 is a schematic diagram illustrating an example of a configuration of a device applicable to the light receiving unit according to the embodiment of the present disclosure.

FIG. 4 is a schematic diagram illustrating an example of a configuration of a device applicable to the light receiving unit 3 according to the embodiment of the present disclosure. In FIG. 4, the light receiving unit 3 is configured by stacking a light receiving chip 3a and a logic chip 3b that are each made of a semiconductor chip. Note that FIG. 4 illustrates the light receiving chip 3a and the logic chip 3b that are separated from each other, for ease of understanding.

On the light receiving chip 3a, the SPAD elements 6a are arranged into the two-dimensional lattice in the region of the pixel array unit 6. The logic chip 3b is provided with the pulse output unit 7 and the control unit 8. Note that the configurations of the light receiving chip 3a and the logic chip 3b are not limited to the example of FIG. 4.

[Configuration and Operation of Pulse Output Unit]

Figure 5:
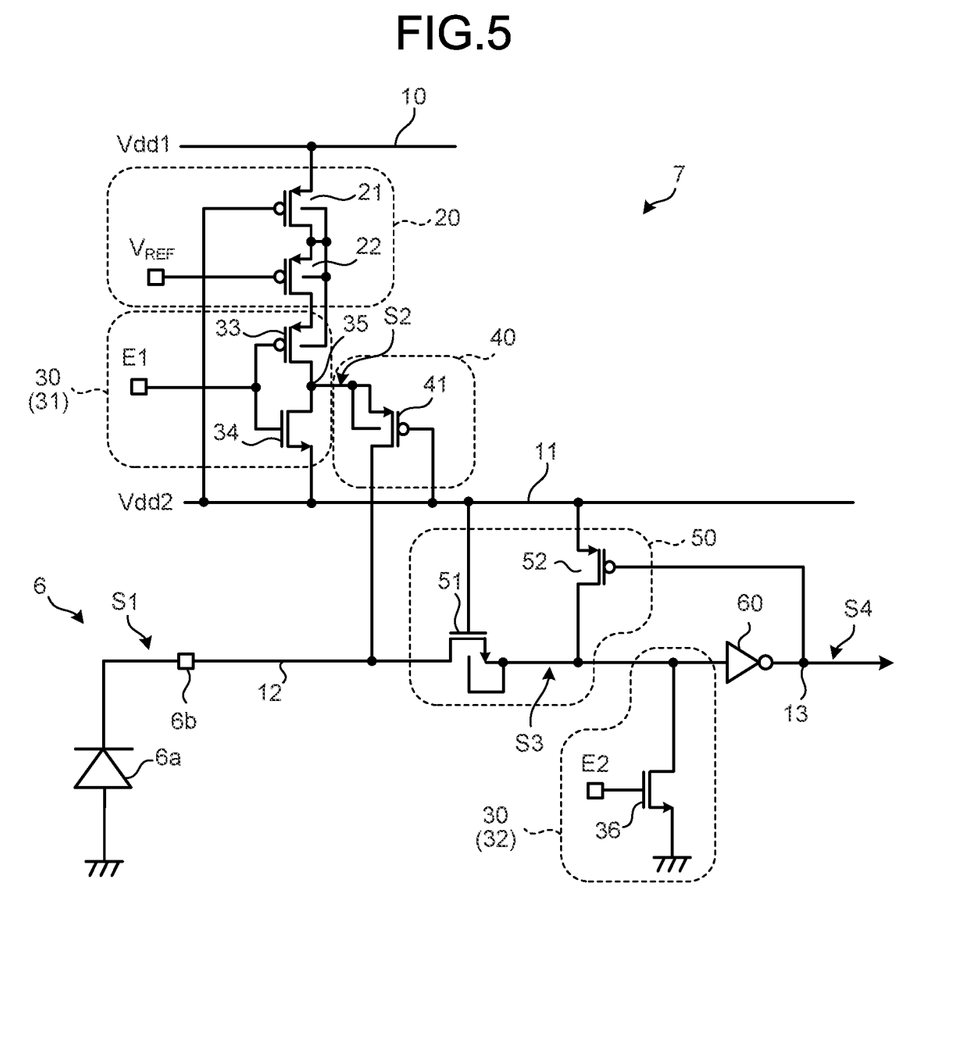
FIG. 5 is a circuit diagram illustrating a configuration example of a pulse output unit according to the embodiment of the present disclosure.

Next, the configuration and operation of the pulse output unit 7 according to the embodiment will be described with reference to FIGS. 5 to 7. FIG. 5 is a circuit diagram illustrating a configuration example of the pulse output unit 7 according to the embodiment of the present disclosure.

As illustrated in FIG. 5, the pulse output unit 7 includes first wiring 10, second wiring 11, a current supply unit 20, an enable unit 30, a first withstand voltage unit 40, a second withstand voltage unit 50, and an inverter 60. In addition, the enable unit 30 includes a first enable unit 31 and a second enable unit 32.

A first power supply voltage Vdd1 is applied to the first wiring 10. The first power supply voltage Vdd1 is a voltage (e.g., 5 V) higher than the withstand voltages (e.g., 3.3 V) of various transistors constituting the pulse output unit 7.

A second power supply voltage Vdd2 is applied to the second wiring 11. The second power supply voltage Vdd2 is a voltage (e.g., 2.5 V) lower than the first power supply voltage Vdd1 and the withstand voltages of the various transistors constituting the pulse output unit 7.

Note that the first power supply voltage Vdd1 and the second power supply voltage Vdd2 are not limited to the above example, and are appropriately adjustable as long as the first power supply voltage Vdd1 has a value higher than the withstand voltages of the various transistors and the second power supply voltage Vdd2 has a value lower than the withstand voltages of the various transistors.

Furthermore, the first power supply voltage Vdd1 and the second power supply voltage Vdd2 are appropriately adjustable as long as a potential difference between the first power supply voltage Vdd1 and the second power supply voltage Vdd2 has a value smaller than those of the withstand voltages of the various transistors.

The current supply unit 20 supplies a predetermined current from the first wiring 10 to the SPAD element 6a. The current supply unit 20 includes a P-type transistor 21 and a P-type transistor 22 that are connected in series. The P-type transistor 21 is an example of a third transistor.

A source of the P-type transistor 21 is connected to the first wiring 10, a drain of the P-type transistor 21 is connected to a source of the P-type transistor 22, and a gate of the P-type transistor 21 is connected to the second wiring 11. Furthermore, a substrate of the P-type transistor 21 is at the same electrical potential as the drain of the P-type transistor 21.

A source of the P-type transistor 22 is connected to the drain of the P-type transistor 21. A drain of the P-type transistor 22 is connected to a source of a P-type transistor 33 included in the first enable unit 31 of the enable unit 30. A substrate of the P-type transistor 22 is at the same electrical potential as the source of the P-type transistor 22.

Furthermore, the control unit 8 inputs a predetermined reference voltage VREF to a gate of the P-type transistor 22. Therefore, the current supply unit 20 supplies the predetermined current controlled by the reference voltage VREF to the cathode of the SPAD element 6a via the first enable unit 31 of the enable unit 30, the first withstand voltage unit 40, and a signal line 12.

Note that the signal line 12 connects the cathode of the SPAD element 6a and an input terminal of the inverter 60 via a connection portion 6b of the pixel array unit 6 and an N-type transistor 51 of the second withstand voltage unit 50. Furthermore, an anode of the SPAD element 6a is grounded, and an output terminal of the inverter 60 is connected to the control unit 8 (see FIG. 3) via a node 13.

The enable unit 30 performs and stops the operation of the SPAD element 6a on the basis of an enable signal transmitted from the outside (e.g., the control unit 8). The first enable unit 31 of the enable unit 30 includes a CMOS circuit including the P-type transistor 33 in an upper channel and an N-type transistor 34 in a lower channel.

Then, when a first enable signal E1 that is part of the enable signal is input to the CMOS circuit, the first enable unit 31 performs and stops the operation of the SPAD element 6a.

For example, when the first enable signal E1 having the same voltage as the second power supply voltage Vdd2 is input, the P-type transistor 33 is made conductive, and a node 35 that is an output unit of the CMOS circuit is connected to the current supply unit 20.

Since this configuration makes it possible to supply the predetermined current from the current supply unit 20 to the SPAD element 6a, the first enable unit 31 can cause the SPAD element 6a to operate. In this configuration, the P-type transistor 33 functions as part of the current supply unit 20.

Meanwhile, when the first enable signal E1 having the same voltage as the first power supply voltage Vdd1 is input, the N-type transistor 34 is made conductive, and the node 35 that is the output unit of the CMOS circuit is connected to the second wiring 11. In other words, the voltage of the node 35 is held at the second power supply voltage Vdd2.

Since this configuration makes it possible to stop the supply of the current from the current supply unit 20 to the SPAD element 6a, the first enable unit 31 can stop the operation of the SPAD element 6a. Note that details of the second enable unit 32 will be described later.

The first withstand voltage unit 40 holds the lower voltage side (i.e., the node 35) of the current supply unit 20 at a voltage equal to or above the second power supply voltage Vdd2. The first withstand voltage unit 40 has a P-type transistor 41.

A source of the P-type transistor 41 is connected to the node 35. A drain of the P-type transistor 41 is connected closer to the SPAD element 6a than to the N-type transistor 51, on the signal line 12. A substrate of the P-type transistor 41 is at the same electrical potential as the source of the P-type transistor 41.

Furthermore, since a gate of the P-type transistor 41 is connected to the second wiring 11, the P-type transistor 41 can hold the node 35 at a voltage equal to or above the second power supply voltage Vdd2. In other words, the first withstand voltage unit 40 can hold the node 35 at a voltage equal to or above the second power supply voltage Vdd2.

The second withstand voltage unit 50 holds the inverter 60 at a voltage equal to or below the second power supply voltage Vdd2. The second withstand voltage unit 50 has the N-type transistor 51 and a P-type transistor 52. The N-type transistor 51 is an example of a first transistor, and the P-type transistor 52 is an example of a second transistor.

A drain of the N-type transistor 51 is connected to the cathode of the SPAD element 6a via the connection portion 6b of the pixel array unit 6. A source of the N-type transistor 51 is connected to the input terminal of the inverter 60. A substrate of the N-type transistor 51 is at the same electrical potential as the source of the N-type transistor 51.

Furthermore, since a gate of the N-type transistor 51 is connected to the second wiring 11, when the voltage of the inverter 60 is higher than the second power supply voltage Vdd2, the N-type transistor 51 is disconnected. This makes it possible for the second withstand voltage unit 50 to hold the inverter 60 at a voltage equal to or below the second power supply voltage Vdd2.

A source of the P-type transistor 52 is connected to the second wiring 11. The source of the P-type transistor 52 is connected to the source of the N-type transistor 51 via the signal line 12. A gate of the P-type transistor 52 is connected to the output terminal of the inverter 60 via the node 13. The function of the P-type transistor 52 will be described later.

The second enable unit 32 of the enable unit 30 includes an N-type transistor 36. A drain of the N-type transistor 36 is connected closer to the inverter 60 than to the N-type transistor 51, on the signal line 12. A source of the N-type transistor 36 is grounded.

Then, when a second enable signal E2 that is part of the enable signal is input to a gate of the N-type transistor 36, the second enable unit 32 performs and stops the operation of the SPAD element 6a.

For example, when the second enable signal E2 having a ground voltage is input, the N-type transistor 36 is disconnected, and thus the signal from the SPAD element 6a can be input to the inverter 60. This configuration makes it possible for the second enable unit 32 to reflect the operation of the SPAD element 6a in the output of the pulse output unit 7.

Furthermore, when the second enable signal E2 having the same voltage as the second power supply voltage Vdd2 is input, the N-type transistor 36 is made conductive, and thus, the cathode of the SPAD element 6a can be clamped to ground potential. This configuration prevents application of the large reverse bias voltage to the cathode of the SPAD element 6a, and thus, the second enable unit 32 can prevent the SPAD element 6a from operating.

Next, the operation of the pulse output unit 7 will be described with reference to FIG. 6 in addition to FIG. 5. FIG. 6 is an explanatory diagram illustrating a timing chart of an operation of the pulse output unit 7 when a SPAD element 6a is operated, in the embodiment of the present disclosure.

For operating the SPAD element 6a, as described above, the first enable signal E1 having the same voltage as the second power supply voltage Vdd2 is input to the first enable unit 31. In addition, the second enable signal E2 having the ground voltage is input to the second enable unit 32.

In an initial state of the pulse output unit 7, the first power supply voltage Vdd1, as the reverse bias voltage, is applied to the SPAD element 6a, until the SPAD element 6a is brought into a state immediately before avalanche amplification called Geiger mode. In other words, in the initial state, a signal S1 that is output from the cathode of the SPAD element 6a is at the first power supply voltage Vdd1.

Furthermore, in the initial state of the pulse output unit 7, a signal S2 that is output from the current supply unit 20 via the node 35 is at the first power supply voltage Vdd1, as in the signal S1.

Furthermore, when the signal S1 output from the cathode of the SPAD element 6a is at the first power supply voltage Vdd1, a drain voltage of the N-type transistor 51 is at the first power supply voltage Vdd1, and a gate voltage of the N-type transistor 51 is at the second power supply voltage Vdd2. Therefore, when the signal S1 is at the first power supply voltage Vdd1, the N-type transistor 51 is disconnected.

Then, in the initial state of the pulse output unit 7, a signal S4 that is output from the inverter 60 is at a low level (e.g., zero (V)), the signal S4 at the low level is input to the gate of the P-type transistor 52, and thus, the P-type transistor 52 is made conductive.

Therefore, the voltage (hereinafter, also referred to as a signal S3) between the source of the N-type transistor 51 and the input terminal of the inverter 60 is at the second power supply voltage Vdd2. Note that the second power supply voltage Vdd2 that is equal to or above a threshold voltage Vth, as the signal S3, is input to the inverter 60, and therefore, the signal S4 output from the inverter 60 is kept at the low level.

As described above, in the initial state of the pulse output unit 7, the first power supply voltage Vdd1 is applied to the drain of the N-type transistor 51, and the second power supply voltage Vdd2 is applied to the source of the N-type transistor 51.

In other words, in the pulse output unit 7, the output of the inverter 60 is fed back to the P-type transistor 52, and thus, during the initial state, that is, when the signal S1 is at the first power supply voltage Vdd1, the second power supply voltage Vdd2 is allowed to be applied to the source of the N-type transistor 51.

Therefore, according to the embodiment, even if the N-type transistor 51 has a withstand voltage lower than the first power supply voltage Vdd1, damage of the N-type transistor 51 can be suppressed.

When one photon is incident on the SPAD element 6a to which the first power supply voltage Vdd1 is applied at time T1, breakdown occurs in the SPAD element 6a, and the current is supplied from the current supply unit 20. Therefore, the voltage of the signal S1 drops from the first power supply voltage Vdd1.

Likewise, the voltage of the signal S2 drops from the first power supply voltage Vdd1 together with the signal S1. Meanwhile, the voltage of the signal S2 falls to voltage Va higher than the second power supply voltage Vdd2, at time T2. This is because the second power supply voltage Vdd2 is applied to the gate of the P-type transistor 41.

Note that this voltage Va has a value obtained by adding a threshold voltage of the P-type transistor 41 to the second power supply voltage Vdd2, and is a voltage lower than the withstand voltages of the various transistors (e.g., the P-type transistor 41).

Preventing the decrease of the voltage of the signal S2 from the second power supply voltage Vdd2, as described above, makes it possible to suppress generation of a potential difference that is higher than the withstand voltages between the sources and the drains of various transistors forming the current supply unit 20.

Therefore, according to the embodiment, even if the current supply unit 20 is formed by various transistors each having the withstand voltage lower than the first power supply voltage Vdd1, it is possible to suppress damage to the various transistors.

Then, when the voltage of the signal S1 changes to the second power supply voltage Vdd2, the drain-gate voltage of the N-type transistor 51 becomes zero, and thus, the N-type transistor 51 is made conductive. Accordingly, the voltage of the signal S3 drops from the second power supply voltage Vdd2 together with the signal S1.

Then, when the voltage of the signal S3 becomes lower than the threshold voltage Vth at time T3, the inverter 60 outputs the signal S4 that is at a high level (e.g., the second power supply voltage Vdd2).

Then, the avalanche amplification in the SPAD element 6a stops at time T4, and the signals S1 and S3 fall to zero (V). Furthermore, the signal S1 and the signal S3 rise as the SPAD element 6a is recharged via the current supply unit 20 (so-called quenching operation).

Furthermore, at time T4 at which the signal S1 and the signal S3 fall to zero (V), the voltage Va is applied to the source of the P-type transistor 41, and the voltage at the drain of the P-type transistor 41 is zero (V).

However, since the voltage Va is lower than the withstand voltage of the P-type transistor 41, even if the voltage of the signal S1 or the like becomes zero (V), damage to the P-type transistor 41 can be suppressed, in the embodiment.

Furthermore, the signal S4 at the high level is input to the gate of the P-type transistor 52, at the time T3 when the signal S4 at the high level is output from the inverter 60, and thus, the P-type transistor 52 is disconnected.

This configuration makes it possible to suppress recharge of the SPAD element 6a from the second wiring 11 via the P-type transistor 52 and the N-type transistor 51. Therefore, according to the embodiment, it is possible to suppress unstable operation of the SPAD element 6a due to current supply to the SPAD element 6a from a supply path other than the current supply unit 20.

Then, at time T5 at which the voltage of the signal S3 becomes equal to or above the threshold voltage Vth, the inverter 60 outputs the signal S4 that is at the low level. Accordingly, the P-type transistor 52 is made conductive, and thus, current is supplied to the SPAD element 6a via the P-type transistor 52 and the N-type transistor 51. Therefore, the signal S1 and the signal S3 rise rapidly.

However, when the voltage of the signal S1 becomes higher than the second power supply voltage Vdd2, the drain-gate voltage of the N-type transistor 51 becomes higher than zero, and thus, the N-type transistor 51 is disconnected. Therefore, the voltage of the signal S3 rises to the second power supply voltage Vdd2 at time T6, and is held at the second power supply voltage Vdd2 after the time T6.

This makes it possible to suppress application of a voltage higher than the second power supply voltage Vdd2 to the P-type transistor 52 and the inverter 60.

Therefore, according to the embodiment, even if the P-type transistor 52 and the inverter 60 are formed by various transistors each having a withstand voltage lower than the first power supply voltage Vdd1, it is possible to suppress damage to the P-type transistor 52 and the inverter 60.

Then, the signal S1 further rises, and the signal S2 rises together with the signal S1 after time T7 when the voltage of the node 35 becomes equal to or above the voltage Va. Finally, the voltages of the signal S1 and the signal S2 (i.e., the cathode of the SPAD element 6a) return to the initial first power supply voltage Vdd1 at time T8, and the SPAD element 6a and the pulse output unit 7 return to the initial state.

As described above, the pulse output unit 7 according to the embodiment is configured to apply the first power supply voltage Vdd1 that is a voltage higher than the withstand voltages of the various transistors, to the cathode of the SPAD element 6a. Therefore, according to the embodiment, the sensitivity characteristic of the SPAD element 6a can be improved.

Furthermore, in the embodiment, as described above, it is possible to suppress generation of the potential difference that is higher than the withstand voltages, with respect to each transistor constituting the pulse output unit 7, in all operation steps of the SPAD element 6a.

Therefore, according to the embodiment, even if the first power supply voltage Vdd1 higher than the withstand voltage is used, it is possible to suppress damage to the various transistors constituting the pulse output unit 7.

Note that when the pulse output unit 7 according to the embodiment is turned on, in order to ensure the withstand voltages of the various transistors, the second power supply voltage Vdd2 is supplied to the second wiring 11 before the first power supply voltage Vdd1 is supplied to the first wiring 10.

Meanwhile, when the second power supply voltage Vdd2 is supplied before the first power supply voltage Vdd1, the second power supply voltage Vdd2 is applied to the drain of the P-type transistor 22 in the current supply unit 20.

This configuration turns on a parasitic diode formed between the drain of the P-type transistor 22 and the substrate, and thus, there is a possibility that a current may flow in the P-type transistor 22.

Therefore, in the embodiment, the P-type transistor 21 in which the substrate is at the same electrical potential as the drain is provided in series with the P-type transistor 22, in the current supply unit 20. In the P-type transistor 21, the drain is at the same electrical potential as the substrate, and thus, even if the second power supply voltage Vdd2 is applied to the drain, the parasitic diode on the inside is not turned on.

In other words, according to the embodiment, providing the P-type transistor 21 in which the substrate is at the same electrical potential as the drain in the current supply unit 20 makes it possible to suppress current flow in the current supply unit 20 when the power supply to the pulse output unit 7 is turned on.

Figure 7:
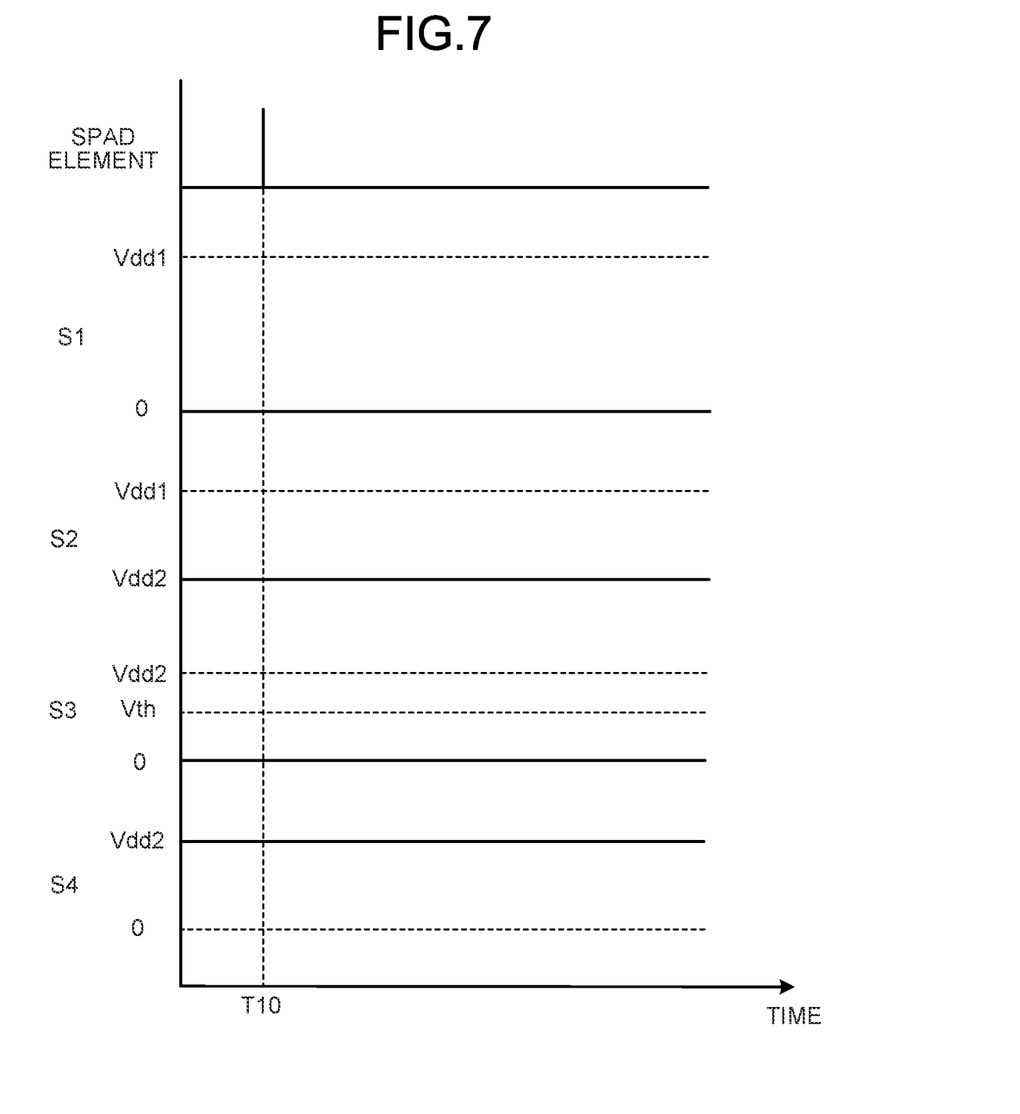
FIG. 7 is an explanatory diagram illustrating a timing chart of an operation of the pulse output unit when the operation of the SPAD element is stopped, in the embodiment of the present disclosure.

FIG. 7 is an explanatory diagram illustrating a timing chart of the operation of the pulse output unit 7 when the operation of the SPAD element 6a is stopped, in the embodiment of the present disclosure.

For stopping the operation of the SPAD element 6a, the first enable signal E1 having the same voltage as the first power supply voltage Vdd1 is input to the first enable unit 31.

Therefore, the N-type transistor 34 is made conductive, and thus, the node 35 that is the output unit of the CMOS circuit is connected to the second wiring 11. Accordingly, in the P-type transistor 41, the source is at the same electrical potential as the gate, and thus, the P-type transistor 41 is disconnected. This configuration makes it possible to stop current supply from the current supply unit 20 to the SPAD element 6a.

Furthermore, for stopping the operation of the SPAD element 6a, the second enable signal E2 having the same voltage as the second power supply voltage Vdd2 is input to the second enable unit 32.

Therefore, the N-type transistor 51 is clamped to the ground potential, and the N-type transistor 51 is made conductive, and thus, the cathode of the SPAD element 6a is also clamped to ground potential.

In this way, when the operation of the SPAD element 6a is stopped, the signal S1 and the signal S3 are clamped to ground potential and the signal S2 is held at the second power supply voltage Vdd2, in the initial state, as illustrated in FIG. 7. Therefore, the signal S4 at the high level (e.g., the second power supply voltage Vdd2) is output from the inverter 60.

Furthermore, when the operation of the SPAD element 6a is stopped, application of no large reverse bias voltage to the cathode causes no avalanche multiplication in the SPAD element 6a, even if one photon is incident on the SPAD element 6a at time T10.

As described above, in the embodiment, the input of the first enable signal E1 that is previously predetermined to the first enable unit 31 and the input of the second enable signal E2 that is previously predetermined to the second enable unit 32 make it possible to stop the operation of the SPAD element 6a.

Figure 6:
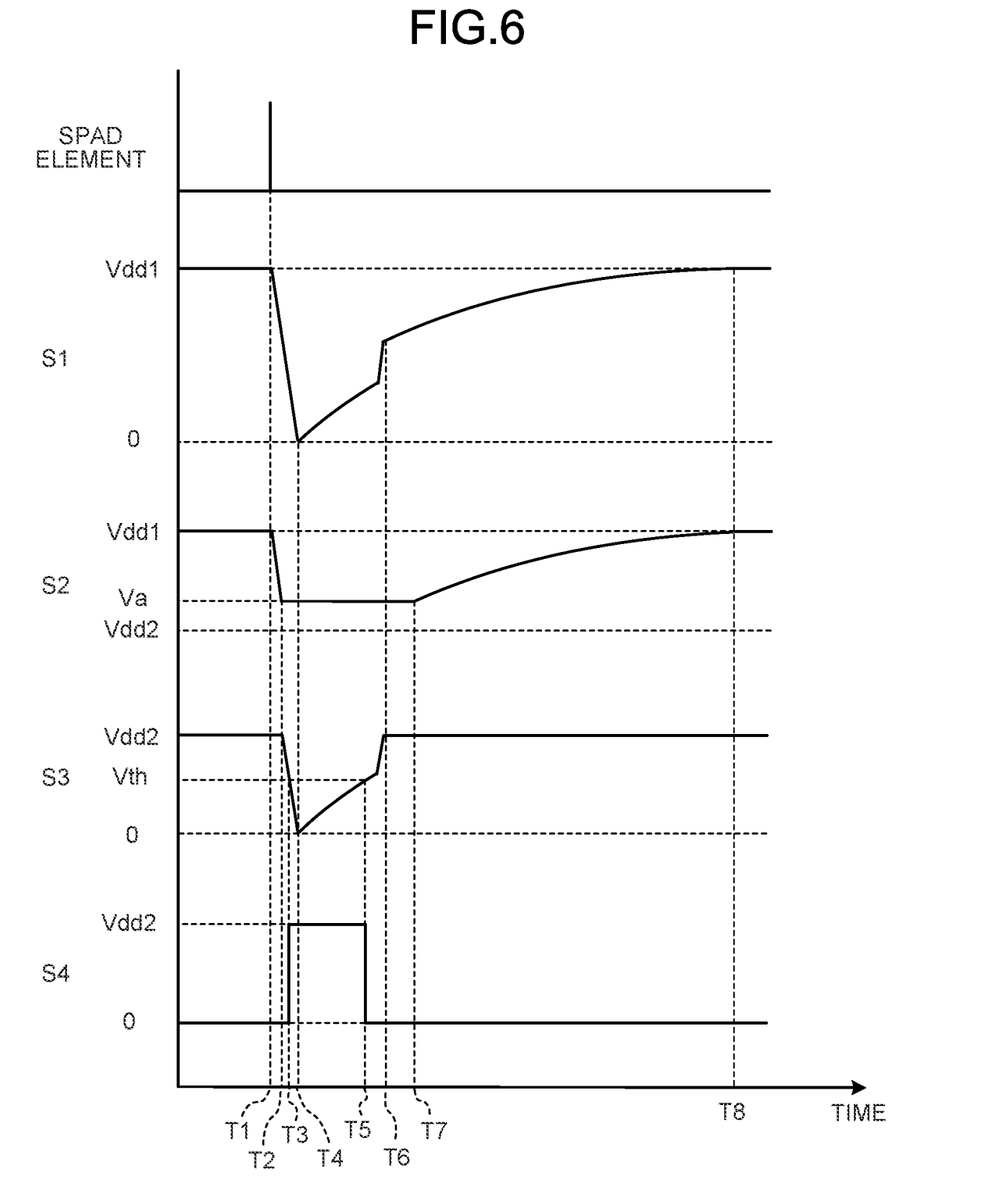
FIG. 6 is an explanatory diagram illustrating a timing chart of an operation of the pulse output unit when a SPAD element is operated, in the embodiment of the present disclosure.

Meanwhile, in the embodiment, as illustrated in FIG. 6, the input of another first enable signal E1 to the first enable unit 31 and the input of another second enable signal E2 to the second enable unit 32 make it possible to operate the SPAD element 6a.

In other words, according to the embodiment, switching of the first enable signal E1 and switching of the second enable signal E2 make it possible to perform and stop the operation of the SPAD element 6a.

Note that, in the embodiment, when the operation of the SPAD element 6a is stopped, the signal S4 at the high level is transmitted from the pulse output unit 7 to the control unit 8, but the control unit 8 is preferably process the signal S4 at the high level, as an OFF signal.

[Effects]

The control circuit according to the embodiment includes the first wiring 10, the second wiring 11, the current supply unit 20, the first withstand voltage unit 40, the inverter 60, and the second withstand voltage unit 50. The first power supply voltage Vdd1 is applied to the first wiring 10. The second power supply voltage Vdd2 lower than first power supply voltage Vdd1 is applied to the second wiring 11. The current supply unit 20 supplies a predetermined current from the first wiring 10 to the SPAD element 6a. The first withstand voltage unit 40 holds the lower voltage side of the current supply unit 20 at a voltage equal to or above the second power supply voltage Vdd2. The inverter 60 is connected to the cathode of the SPAD element 6a. The second withstand voltage unit 50 holds the inverter 60 at a voltage equal to or below the second power supply voltage Vdd2. Furthermore, the second withstand voltage unit 50 has an N-type first transistor (the N-type transistor 51) and a P-type second transistor (the P-type transistor 52). The N-type first transistor (the N-type transistor 51) is provided between the cathode of the SPAD element 6a and the input terminal of the inverter 60, and has a gate that is connected to the second wiring 11. The P-type second transistor (the P-type transistor 52) is provided between the second wiring 11 and the source of the first transistor (the N-type transistor 51), and has a gate that is connected to the output terminal of the inverter 60.

This configuration makes it possible to improve the sensitivity characteristic of the SPAD element 6a.

Furthermore, in the control circuit according to the embodiment, the first power supply voltage Vdd1 is higher than the withstand voltages of the first transistor (the N-type transistor 51) and the second transistor (the P-type transistor 52). Furthermore, the second power supply voltage Vdd2 is lower than the withstand voltages of the first transistor (the N-type transistor 51) and the second transistor (the P-type transistor 52). Still furthermore, the potential difference between the first power supply voltage Vdd1 and the second power supply voltage Vdd2 is lower than the withstand voltages of the first transistor (the N-type transistor 51) and the second transistor (the P-type transistor 52).

Therefore, even if the first power supply voltage Vdd1 higher than the withstand voltage is used, it is possible to suppress damage to the various transistors constituting the pulse output unit 7.

Furthermore, in the control circuit according to the embodiment, the current supply unit 20 has a P-type third transistor (the P-type transistor 21) having a source that is connected to the first wiring 10, a gate that is connected to the second wiring 11, and a drain that is at the same electrical potential as the substrate.

This configuration makes it possible to suppress current flow in the current supply unit 20 when the pulse output unit 7 is turned on.

Furthermore, the control circuit according to the embodiment further includes the enable unit 30 that performs and stops the operation of the SPAD element 6a, on the basis of the enable signal. The enable unit 30 has the first enable unit 31 and the second enable unit 32. The first enable unit 31 holds the lower voltage side of the current supply unit 20 at the voltage of the second power supply voltage Vdd2 on the basis of the enable signal (the first enable signal E1). The second enable unit 32 grounds the input terminal of the inverter 60 on the basis of the enable signal (the second enable signal E2).

This configuration makes it possible to stop the operation of the SPAD element 6a.

The embodiments of the present disclosure have been described above, but the technical scope of the present disclosure is not limited to the embodiments described above, and various modifications and alterations can be made without departing from the spirit and scope of the present disclosure. Moreover, the component elements of different embodiments and modifications may be suitably combined with each other.

For example, in the embodiments, the example has been described in which the current supply unit 20 has the configuration including the P-type transistor 21 and the P-type transistor 22, but the current supply unit 20 is not limited to the configuration including the P-type transistor 21 and the P-type transistor 22.

Furthermore, in the embodiments, the example in which the first enable unit 31 has the configuration including the CMOS circuit has been described, but the first enable unit 31 is not limited to the configuration including the CMOS circuit.

Furthermore, in the embodiments, the example in which the second enable unit 32 has the configuration including the N-type transistor 36 has been described, but the second enable unit 32 is not limited to the configuration including the N-type transistor 36.

Furthermore, in the embodiments, the example in which the first withstand voltage unit 40 has the configuration including the P-type transistor 41 has been described, but the first withstand voltage unit 40 is not limited to the configuration including the P-type transistor 41.

Furthermore, in the embodiments, the example in which the second withstand voltage unit 50 has the configuration including the N-type transistor 51 and the P-type transistor 52 has been described, but the second withstand voltage unit 50 is not limited to the configuration including the N-type transistor 51 and the P-type transistor 52.

Furthermore, the effects described herein are merely examples, the present invention is not limited to the effects, and other effects may also be provided.

Note that the present technology may also employ the following configurations.

(1)

A control circuit comprising:
first wiring to which a first power supply voltage is applied;
second wiring to which a second power supply voltage lower than the first power supply voltage is applied;
a current supply unit configured to supply a predetermined current from the first wiring to a single photon avalanche diode (SPAD) element;
a first withstand voltage unit configured to hold a lower voltage side of the current supply unit at a voltage equal to or above the second power supply voltage;
an inverter connected to a cathode of the SPAD element; and
a second withstand voltage unit configured to hold the inverter at a voltage equal to or below the second power supply voltage, wherein
the second withstand voltage unit includes:
an N-type first transistor that is provided between the cathode of the SPAD element and an input terminal of the inverter, and has a gate connected to the second wiring; and
a P-type second transistor that is provided between the second wiring and a source of the first transistor, and has a gate connected to an output terminal of the inverter.

(2)

The control circuit according to (1), wherein
the first power supply voltage is higher than withstand voltages of the first transistor and the second transistor,
the second power supply voltage is lower than the withstand voltages of the first transistor and the second transistor, and
a potential difference between the first power supply voltage and the second power supply voltage is lower than the withstand voltages of the first transistor and the second transistor.

(3)

The control circuit according to (1) or (2), wherein
the current supply unit includes
a P-type third transistor having a source that is connected to the first wiring, a gate that is connected to the second wiring, and a drain that is at the same electrical potential as a substrate.

(4)

The control circuit according to any one of (1) to (3), further comprising
an enable unit configured to perform and stop operation of the SPAD element based on an enable signal, wherein
the enable unit includes:
a first enable unit configured to hold the lower voltage side of the current supply unit at the second power supply voltage based on the enable signal; and
a second enable unit configured to ground the input terminal of the inverter based on the enable signal.

(5)

A distance measurement system comprising:
a light source configured to irradiate an object to be measured with light;
a SPAD element configured to output a signal when receiving light reflected from the object to be measured; and
a control circuit including first wiring to which a first power supply voltage is applied, second wiring to which a second power supply voltage lower than the first power supply voltage is applied, a current supply unit configured to supply a predetermined current from the first wiring to the SPAD element, a first withstand voltage unit configured to hold a lower voltage side of the current supply unit at a voltage equal to or above the second power supply voltage, an inverter connected to a cathode of the SPAD element, and a second withstand voltage unit configured to hold the inverter at a voltage equal to or below the second power supply voltage, the second withstand voltage unit including an N-type first transistor that is provided between the cathode of the SPAD element and an input terminal of the inverter, and has a gate connected to the second wiring, and a P-type second transistor that is provided between the second wiring and a source of the first transistor, and has a gate connected to an output terminal of the inverter.

(6)

The distance measurement system according to (5), in which
the first power supply voltage is higher than withstand voltages of the first transistor and the second transistor,
the second power supply voltage is lower than the withstand voltages of the first transistor and the second transistor, and a potential difference between the first power supply voltage and the second power supply voltage is lower than the withstand voltages of the first transistor and the second transistor.

(7)

The distance measurement system according to (5) or (6), in which the current supply unit includes a P-type third transistor having a source that is connected to the first wiring, a gate that is connected to the second wiring, and a drain that is at the same electrical potential as a substrate.

(8)

The distance measurement system according to any one of (5) to (7), in which the control circuit further includes an enable unit configured to perform and stop operation of the SPAD element based on an enable signal, and the enable unit includes:

a first enable unit configured to hold the lower voltage side of the current supply unit at the second power supply voltage based on the enable signal; and a second enable unit configured to ground the input terminal of the inverter based on the enable signal.

REFERENCE SIGNS LIST

1 DISTANCE MEASUREMENT DEVICE (EXAMPLE OF DISTANCE MEASUREMENT SYSTEM)
2 LIGHT SOURCE UNIT
3 LIGHT RECEIVING UNIT
6a SPAD ELEMENT
7 PULSE OUTPUT UNIT
8 CONTROL UNIT
10 FIRST WIRING
11 SECOND WIRING
20 CURRENT SUPPLY UNIT
21 P-TYPE TRANSISTOR (EXAMPLE OF THIRD TRANSISTOR)
30 ENABLE UNIT
31 FIRST ENABLE UNIT
32 SECOND ENABLE UNIT
40 FIRST WITHSTAND VOLTAGE UNIT
50 SECOND WITHSTAND VOLTAGE UNIT
51 N-TYPE TRANSISTOR (EXAMPLE OF FIRST TRANSISTOR)
52 P-TYPE TRANSISTOR (EXAMPLE OF SECOND TRANSISTOR)
60 INVERTER

The invention claimed is:

1. A control circuit comprising:

first wiring to which a first power supply voltage is applied;

second wiring to which a second power supply voltage lower than the first power supply voltage is applied;

a current supply unit configured to supply a predetermined current from the first wiring to a single photon avalanche diode (SPAD) element;

a first withstand voltage unit configured to hold a lower voltage side of the current supply unit at a voltage equal to or above the second power supply voltage;

an inverter connected to a cathode of the SPAD element; and a second withstand voltage unit configured to hold the inverter at a voltage equal to or below the second power supply voltage, wherein the second withstand voltage unit includes:

an N-type first transistor that is provided between the cathode of the SPAD element and an input terminal of the inverter, and has a gate connected to the second wiring; and a P-type second transistor that is provided between the second wiring and a source of the N-type first transistor, and has a gate connected to an output terminal of the inverter.

2. The control circuit according to claim 1, wherein the first power supply voltage is higher than withstand voltages of the N-type first transistor and the P-type second transistor, the second power supply voltage is lower than the withstand voltages of the N-type first transistor and the P-type second transistor, and a potential difference between the first power supply voltage and the second power supply voltage is lower than the withstand voltages of the N-type first transistor and the P-type second transistor.

3. The control circuit according to claim 1, wherein the current supply unit includes a P-type third transistor having a source that is connected to the first wiring, a gate that is connected to the second wiring, and a drain that is at the same electrical potential as a substrate.

4. The control circuit according to claim 1, further comprising an enable unit configured to perform and stop operation of the SPAD element based on an enable signal, wherein the enable unit includes:

a first enable unit configured to hold the lower voltage side of the current supply unit at the second power supply voltage based on the enable signal; and a second enable unit configured to ground the input terminal of the inverter based on the enable signal.

5. A distance measurement system comprising:

a light source configured to irradiate an object to be measured with light;

a SPAD element configured to output a signal when receiving light reflected from the object to be measured; and a control circuit including:

first wiring to which a first power supply voltage is applied;

second wiring to which a second power supply voltage lower than the first power supply voltage is applied;

a current supply unit configured to supply a predetermined current from the first wiring to the SPAD element;

a first withstand voltage unit configured to hold a lower voltage side of the current supply unit at a voltage equal to or above the second power supply voltage;

an inverter connected to a cathode of the SPAD element; and a second withstand voltage unit configured to hold the inverter at a voltage equal to or below the second power supply voltage, wherein the second withstand voltage unit includes:

an N-type first transistor that is provided between the cathode of the SPAD element and an input terminal of the inverter, and has a gate connected to the second wiring; and a P-type second transistor that is provided between the second wiring and a source of the first N-type transistor, and has a gate connected to an output terminal of the inverter.

* * * * *